United States Patent
Yamaguchi et al.

(10) Patent No.: US 11,873,420 B2
(45) Date of Patent: Jan. 16, 2024

(54) CATION-CONTAINING POLISHING COMPOSITION FOR ELIMINATING PROTRUSIONS AROUND LASER MARK

(71) Applicant: NISSAN CHEMICAL CORPORATION, Tokyo (JP)

(72) Inventors: Hayato Yamaguchi, Funabashi (JP); Hibiki Ishijima, Funabashi (JP); Eiichiro Ishimizu, Funabashi (JP)

(73) Assignee: NISSAN CHEMICAL CORPORATION, Tokyo (JP)

( * ) Notice: Subject to any disclaimer, the term of this patent is extended or adjusted under 35 U.S.C. 154(b) by 0 days.

(21) Appl. No.: 17/431,681

(22) PCT Filed: Sep. 28, 2020

(86) PCT No.: PCT/JP2020/036667
§ 371 (c)(1),
(2) Date: Aug. 17, 2021

(87) PCT Pub. No.: WO2021/065815
PCT Pub. Date: Apr. 8, 2021

(65) Prior Publication Data
US 2022/0049126 A1 Feb. 17, 2022

(30) Foreign Application Priority Data

Oct. 3, 2019 (JP) .................................. 2019-183284

(51) Int. Cl.
*C09G 1/02* (2006.01)
*H01L 21/304* (2006.01)

(52) U.S. Cl.
CPC ............... *C09G 1/02* (2013.01); *H01L 21/304* (2013.01)

(58) Field of Classification Search
None
See application file for complete search history.

(56) References Cited

U.S. PATENT DOCUMENTS

| | | | | |
|---|---|---|---|---|
| 5,885,334 A | * | 3/1999 | Suzuki | C09G 1/02 106/3 |
| 6,465,403 B1 | * | 10/2002 | Skee | C11D 7/261 257/E21.228 |
| 2008/0038996 A1 | * | 2/2008 | Maejima | C09K 3/1463 451/37 |

FOREIGN PATENT DOCUMENTS

| | | |
|---|---|---|
| JP | H09-306880 A | 11/1997 |
| JP | 2009-516928 A | 4/2009 |
| JP | 2015-233031 A | 12/2015 |
| JP | 2017-183359 A | 10/2017 |
| JP | 2018-019075 A | 2/2018 |
| WO | 2015/019706 A1 | 2/2015 |
| WO | 2017/110315 A1 | 6/2017 |
| WO | 2019/065357 A1 | 4/2019 |

OTHER PUBLICATIONS

Dec. 8, 2020 International Search Report issued in International Patent Application No. PCT/JP2020/036667.
Apr. 8, 2021 Written Opinion of the International Search Authority issued in International Patent Application No. PCT/JP2020/036667.
Sep. 21, 2022 Office Action issued in Chinese Patent Application No. 202080014096.0.

* cited by examiner

Primary Examiner — Stephanie P Duclair
(74) Attorney, Agent, or Firm — Oliff PLC

(57) ABSTRACT

A polishing composition eliminating protrusions around a laser mark in wafer polishing processes, the manufacturing method therefor and a polishing method using the composition. The polishing composition including silica particles and water, wherein: the composition includes a tetraalkylammonium ion such that the mass ratio of the ion to $SiO_2$ of the silica particles is 0.400 to 1.500:1, and the mass ratio of $SiO_2$ dissolved in the polishing composition to $SiO_2$ is 0.100 to 1.500:1; the tetraalkylammonium ion is derived from a compound selected from the group made of an alkali silicate, a hydroxide, a carbonate, a sulfate, and a halide while the ion is contained in the polishing composition in 0.2% by mass to 8.0% by mass; and the dissolved $SiO_2$ is derived from a tetraalkylammonium silicate, a potassium silicate, a sodium silicate, or a mixture of any of these.

12 Claims, No Drawings

CATION-CONTAINING POLISHING COMPOSITION FOR ELIMINATING PROTRUSIONS AROUND LASER MARK

TECHNICAL FIELD

The present invention relates to a polishing composition used for polishing the surface of a wafer. More particularly, the present invention relates to a polishing composition used in a wafer polishing process for achieving a flat polished surface having no level difference around a wafer (which may be referred to as, for example, "laser mark portion").

BACKGROUND ART

A silicon wafer used for a semiconductor product is finished to have a mirror surface by a lapping process (rough grinding process) and a polishing process (precise polishing process). The polishing process includes a preliminary polishing process and a final polishing process.

For the purpose of, for example, identification, a silicon wafer may be provided with a mark (laser mark) such as a barcode, a numeral, or a symbol by irradiating the surface of the silicon wafer with laser light. In general, a silicon substrate is provided with such a laser mark after completion of a lapping process for the substrate and before initiation of a polishing process therefor. The laser light irradiation for providing the laser mark generally causes a protrusion (bump) on the silicon wafer surface around the laser mark. The laser mark portion of the silicon wafer is not used for a final product. However, when the aforementioned protrusion is not appropriately eliminated in the polishing process after provision of the laser mark, the yield of the product may be reduced to a level lower than expected. Thus, it is desired to appropriately eliminate the protrusion around the laser mark in a preliminary polishing process.

The phrase "elimination of a protrusion around a laser mark" as used herein refers to a decrease in the peak height of a protrusion as measured from a reference plane (horizontal plane) around a laser mark of a wafer.

Patent Document 1 proposes a method for producing a polished polishing object, wherein the method is intended to reduce the height of a laser mark.

Patent Document 2 proposes a polishing composition and a method for polishing a silicon substrate with the polishing composition, wherein the method is intended to reduce irregularities caused by a protrusion generated around a hard laser mark.

Patent Document 3 proposes a polishing method that is intended to eliminate a protrusion around a hard laser mark.

PRIOR ART DOCUMENTS

Patent Documents

Patent Document 1: International Publication WO 2015/019706
Patent Document 2: International Publication WO 2017/110315
Patent Document 3: Japanese Unexamined Patent Application Publication No. 2017-183359 (JP 2017-183359 A)

SUMMARY OF THE INVENTION

Problems to be Solved by the Invention

However, the method for producing a polished polishing object described in Patent Document 1 is intended to reduce the height of a laser mark to 30 nm or less, and requires two polishing steps using two types of polishing compositions. The method has room for improvement in appropriate elimination of a protrusion around a laser mark.

The polishing composition and the method for polishing a silicon substrate with the polishing composition described in Patent Document 2 are intended to reduce the height of a protrusion generated around a hard laser mark to about 20 nm to 30 nm. The method has room for improvement in appropriate elimination of a protrusion around a laser mark.

The polishing method described in Patent Document 3 is intended to reduce the height of a laser mark to 50 nm or less, and requires two polishing steps using two types of polishing slurries. The method has room for improvement in appropriate elimination of a protrusion around a laser mark.

The present invention provides a polishing composition used in a wafer polishing process for eliminating a protrusion around a laser mark, thereby achieving a flat polished surface, as well as a wafer polishing method using the polishing composition.

Means for Solving the Problems

The present inventors have conducted extensive studies for solving the aforementioned problems, and as a result have found that a protrusion around a laser mark exhibits higher wettability than any other portions, and thus a good balance between the hydrophilicity and hydrophobicity of a polishing component is required for efficient contact of the polishing component with the protrusion and flattening of the protrusion through polishing. Based on this finding, the present inventors have conceived that the hydrophilicity of polishing particles contained in the polishing component must be increased for efficient contact of the polishing particles with the protrusion of the laser mark. Consequently, the present inventors have found that the protrusion of the laser mark can be efficiently polished with a composition containing a specific amount of a dissolved silica component relative to silica particles serving as abrasive grains, and a specific amount of a tetraalkylammonium ion serving as a cationic component for imparting alkalinity. The present invention has been accomplished on the basis of this finding.

Accordingly, a first aspect of the present invention is a polishing composition comprising silica particles and water, characterized in that the polishing composition further comprises a tetraalkylammonium ion such that the mass ratio of the tetraalkylammonium ion to $SiO_2$ of the silica particles is 0.400 to 1.500:1, and the mass ratio of $SiO_2$ dissolved in the polishing composition to $SiO_2$ of the silica particles is 0.100 to 1.500:1.

A second aspect of the present invention is the polishing composition according to the first aspect, wherein the tetraalkylammonium ion is derived from a compound selected from the group consisting of an alkali silicate, a hydroxide, a carbonate, a sulfate, and a halide, and the tetraalkylammonium ion is contained in the polishing composition in an amount of 0.2% by mass to 8.0% by mass.

A third aspect of the present invention is the polishing composition according to the first aspect, wherein the dissolved $SiO_2$ is derived from a tetraalkylammonium silicate, a potassium silicate, a sodium silicate, or a mixture of any of these, and the dissolved $SiO_2$ is contained in the polishing composition in an amount of 0.1% by mass to 8.0% by mass.

A fourth aspect of the present invention is the polishing composition according to any one of the first to third aspects, wherein the dissolved $SiO_2$ is a silica having an average primary particle diameter of less than 1 nm, or a silicate anion.

A fifth aspect of the present invention is the polishing composition according to any one of the first to fourth aspects, wherein the tetraalkylammonium ion is a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

A sixth aspect of the present invention is the polishing composition according to any one of the first to fifth aspects, wherein the silica particles have an average primary particle diameter of 1 nm to 100 nm, and the polishing composition has a silica concentration based on the silica particles of 0.1% by mass to 30% by mass.

A seventh aspect of the present invention is the polishing composition according to any one of the first to sixth aspects, wherein the polishing composition has pH of 11 to 13.

An eighth aspect of the present invention is the polishing composition according to any one of the first to seventh aspects, wherein the polishing composition is used for elimination of a laser mark of a silicon wafer.

A ninth aspect of the present invention is a method for eliminating a laser mark of a silicon wafer, the method using the polishing composition according to any one of the first to eighth aspects.

A tenth aspect of the present invention is a method for producing the polishing composition according to any one of the first to eighth aspects, the method comprising a step of mixing an aqueous silica sol with a tetraalkylammonium hydroxide, a potassium hydroxide, a sodium hydroxide, or a mixture of any of these, heating the resultant mixture at 40° C. to 100° C. for 0.5 hours to 20 hours to thereby produce an alkali silicate, and generating dissolved $SiO_2$ derived from the alkali silicate.

An eleventh aspect of the present invention is a method for producing the polishing composition according to any one of the first to eighth aspects, the method comprising a step of mixing an aqueous silica sol with a tetraalkylammonium silicate, a potassium silicate, a sodium silicate, or a mixture of any of these.

A twelfth aspect of the present invention is a method for producing a polishing composition, the method comprising a step of diluting the polishing composition according to any one of the first to eighth aspects with water before or during polishing of a to-be-polished material so that the silica concentration based on the silica particles is adjusted to 0.1% by mass to 4.0% by mass, the tetraalkylammonium ion concentration is adjusted to 0.2% by mass to 4.0% by mass, and the dissolved $SiO_2$ concentration is adjusted to 0.1% by mass to 2.0% by mass.

A thirteenth aspect of the present invention is a method for polishing a silicon wafer, the method using a polishing composition produced by the method according to the twelfth aspect.

Effects of the Invention

When a wafer is polished with the polishing composition of the present invention, the polishing composition exhibits the effect of eliminating a protrusion around a laser mark to thereby achieve a flat polished surface.

MODES FOR CARRYING OUT THE INVENTION

The present invention is directed to a polishing composition containing silica particles and water, characterized in that the polishing composition further contains a tetraalkylammonium ion such that the mass ratio of the tetraalkylammonium ion to $SiO_2$ of the silica particles is 0.400 to 1.500:1, and the mass ratio of $SiO_2$ dissolved in the polishing composition to $SiO_2$ of the silica particles is 0.100 to 1.500:1.

The silica particles contained in the polishing composition of the present invention may be in the form of an aqueous dispersion of silica particles having an average primary particle diameter of 1 nm to 100 nm. Such an aqueous dispersion is a silica sol, and the silica contained in the silica sol corresponds to the silica particles contained in the polishing composition of the present invention. The aqueous medium in the silica sol may be replaced with water contained in the polishing composition. The water contained in the polishing composition is derived from water in the silica sol. In addition, water may be further added for dilution of the polishing composition.

The silica particles used in the present invention are colloidal silica having an average primary particle diameter of 1 nm to 100 nm as determined by the nitrogen adsorption method. Silica particles having an average primary particle diameter of less than 1 nm cause a reduction in polishing rate, and the silica particles are likely to aggregate, resulting in poor stability of the resultant polishing composition. Silica particles having an average primary particle diameter of more than 100 nm are likely to generate scratches on the surface of a wafer, and cause poor planarity of the polished surface.

When coarse particles having a diameter of 0.5 µm or more are contained in a silica sol prepared by dispersion of silica particles in an aqueous medium, the coarse particles are preferably removed. The coarse particles can be removed by the forced precipitation method or the microfiltration method. The filter used for the microfiltration may be any of, for example, a depth filter, a pleated filter, a membrane filter, and a hollow fiber filter. The material of such a filter may be any of, for example, cotton, polypropylene, polystyrene, polysulfone, polyethersulfone, nylon, cellulose, and glass. The filtration accuracy of a filter is represented by absolute filtration accuracy (size of particles trapped 99.9% or more). The aforementioned silica particles are preferably treated with a filter having an absolute filtration accuracy of 0.5 µm to 1.0 µm, from the viewpoint of production efficiency (e.g., treatment time or the degree of filter clogging).

The pH of a silica sol may be adjusted with, for example, ammonia, and a polymer, a chelating agent, etc. may be added to the silica sol. The pH adjustment of the silica sol may be performed before, after, or before and after addition of the compound (polymer) or the chelating agent.

The pH of the polishing composition of the present invention can be adjusted to fall within a range of 11 to 13 or 11 to 12. Preferably, the pH is adjusted to fall within the aforementioned range before polishing.

The alkaline component used for such pH adjustment may be an aqueous solution of, for example, sodium hydroxide, potassium hydroxide, ammonia, primary ammonium hydroxide, secondary ammonium hydroxide, tertiary ammonium hydroxide, quaternary ammonium hydroxide (e.g., tetraalkylammonium hydroxide), an organic amine, or an alkali metal carbonate. In particular, an aqueous solution of sodium hydroxide or potassium hydroxide, or an aqueous solution of tetraalkylammonium hydroxide is preferably used.

Examples of the tetraalkylammonium hydroxide include tetramethylammonium hydroxide, tetraethylammonium hydroxide, tetrapropylammonium hydroxide, tetrabutylammonium hydroxide, ethyltrimethylammonium hydroxide, diethyldimethylammonium hydroxide, and methyltriethylammonium hydroxide. In particular, tetramethylammonium hydroxide is preferably used.

The polishing composition of the present invention contains a tetraalkylammonium ion and $SiO_2$ dissolved in the polishing composition, and the tetraalkylammonium ion and the dissolved $SiO_2$ form an alkali silicate.

The tetraalkylammonium ion contained in the polishing composition of the present invention is a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

The aforementioned tetraalkylammonium ion is derived from a compound selected from the group consisting of an alkali silicate, a hydroxide, a carbonate, a sulfate, and a halide. The polishing composition of the present invention may contain the tetraalkylammonium ion in an amount of 0.2% by mass to 8.0% by mass.

The dissolved $SiO_2$ (hereinafter may be referred to as, for example, "dissolved silica") is a silica component having no particulate property and being dissolved in an aqueous medium of the polishing composition. The centrifugal filtration of the polishing composition can separate silica particles from the dissolved $SiO_2$. The dissolved $SiO_2$ is difficult to determine through observation with a transmission electron microscope, and thus the dissolved $SiO_2$ probably has no particulate property or has an average primary particle diameter of less than 1 nm even when, for example, an oligomer is present. Thus, the dissolved $SiO_2$ is in the form of silica having an average primary particle diameter of less than 1 nm or a silicate anion, and the silicate anion is in the form of, for example, a silicate ion monomer, a silicate ion dimer, or a colloidal silicate ion micelle. Any of these are dissolved in the polishing composition.

The dissolved $SiO_2$ may be present in the form of a silicate anion.

The oligomeric silica or silicate anion forming the dissolved $SiO_2$ may contain a cation serving as a counter ion.

The dissolved $SiO_2$ present together with silica particles preferably contains a certain amount of an alkalinity-providing cation, and the dissolved $SiO_2$ and the alkaline cation form an alkali silicate. In the present invention, silica abrasive grains (silica particles) and water are derived from the aqueous silica sol. The polishing composition of the present invention can be produced by addition of the alkali silicate to the aqueous silica sol.

The cation contained in the polishing composition can be regarded as the sum of the cation derived from the alkali silicate and the cation derived from a hydroxide or a carbonate.

The aforementioned dissolved $SiO_2$ is derived from an alkali silicate containing tetraalkylammonium silicate, potassium silicate, sodium silicate, or a mixture of any of these. The polishing composition of the present invention may contain a portion of dissolved silica particles serving as abrasive grains. The polishing composition of the present invention may contain the dissolved $SiO_2$ in an amount of 0.1% by mass to 8.0% by mass. In particular, tetraalkylammonium silicate is preferably used. The ratio of tetraalkylammonium silicate to another silicate may be 1:0 to 0.8, or 1:0 to 0.5, or 1:0 to 0.35.

From the viewpoint of the polishing property of the polishing composition used for elimination of a laser mark of a silicon wafer, the mass ratio of $SiO_2$ dissolved in the tetraalkylammonium ion to silica particles serving as abrasive grains, i.e., (tetraalkylammonium ion)/($SiO_2$ particles) is preferably 0.400 to 1.500, and the mass ratio of the dissolved $SiO_2$ to the silica particles, i.e., (dissolved $SiO_2$)/($SiO_2$ particles) is preferably 0.100 to 1.500.

The polishing composition of the present invention can be produced by mixing an aqueous silica sol with an alkali silicate. The polishing composition may optionally contain, for example, a hydroxide, a carbonate, a sulfate, and a halide.

The alkali silicate may be, for example, tetraalkylammonium silicate, potassium silicate, sodium silicate, or a mixture of any of these.

Examples of the hydroxide include tetraalkylammonium hydroxide, potassium hydroxide, and sodium hydroxide.

Examples of the carbonate include tetraalkylammonium carbonate, potassium carbonate, and sodium carbonate.

Examples of the sulfate include tetraalkylammonium sulfate, potassium sulfate, and sodium sulfate.

Examples of the halide include tetraalkylammonium chloride, tetraalkylammonium bromide, potassium chloride, potassium bromide, sodium chloride, and sodium bromide.

The aforementioned alkali silicate can be produced by mixing an aqueous silica sol with tetraalkylammonium hydroxide, potassium hydroxide, sodium hydroxide, or a mixture of any of these, and heating the resultant mixture at 40° C. to 100° C. for 0.5 hours to 20 hours. The polishing composition of the present invention is produced through these steps of producing the alkali silicate.

The production of the tetraalkylammonium silicate will now be described by taking tetramethylammonium silicate as an example. Specifically, tetramethylammonium silicate can be produced by heating an aqueous silica sol having a silica concentration of 5.0% by mass to 50% by mass and an alkali content (Na content) of 0.0001% by mass to 0.5000% by mass and an aqueous tetramethylammonium hydroxide solution (concentration: 5.0% by mass to 25% by mass) at 60° C. to 100° C. for two hours to 10 hours. The aforementioned heating can be performed with stirring by using a stirring apparatus such as a disper.

The tetraalkylammonium silicate can be produced so as to achieve a ratio by mole in terms of $SiO_2/M_2O$ of 2 to 4, typically 3.0. The aforementioned M represents a tetramethylammonium ion, a tetraethylammonium ion, a tetrapropylammonium ion, a tetrabutylammonium ion, an ethyltrimethylammonium ion, a diethyldimethylammonium ion, or a methyltriethylammonium ion. The $SiO_2$ concentration is 1.0% by mass to 20% by mass, typically 10% by mass, and the tetraalkylammonium hydroxide concentration is 1.0% by mass to 20% by mass, typically 10% by mass. The solid content is 2.0% by mass to 40% by mass, typically 20% by mass.

The production of the alkali metal silicate will now be described by taking potassium silicate as an example. Specifically, potassium silicate can be produced by heating an aqueous silica sol having a silica concentration of 5.0% by mass to 50% by mass and an alkali content (Na content) of 0.0001% by mass to 0.5000% by mass and an aqueous potassium hydroxide solution (concentration: 2.0% by mass to 48% by mass) at 60° C. to 100° C. for two hours to 10 hours. For the aforementioned production, the aqueous silica sol is heated at 40° C. to 50° C. for 0.5 hours to one hour before addition of the aqueous potassium hydroxide solution, the aqueous potassium hydroxide solution is added to the aqueous silica sol at the temperature, and then the resultant mixture is heated at 90° C. to 100° C. for two hours to 10 hours. The aforementioned heating can be performed with stirring by using a stirring apparatus such as a disper.

The alkali metal silicate can be produced so as to achieve a ratio by mole in terms of $SiO_2/M_2O$ of 2 to 5, typically 3.85. The aforementioned M represents a potassium ion or a sodium ion. The $SiO_2$ concentration is 2.0% by mass to 30% by mass, typically 20% by mass, and the potassium hydroxide concentration is 1.0% by mass to 30% by mass, typically 9.7% by mass. The solid content is 3.0% by mass to 60% by mass, typically 30% by mass.

The aforementioned silica particles are silica particles derived from the aqueous silica sol. An alkaline component, a water-soluble compound, and a chelating agent may optionally be added to the silica sol to thereby prepare a polishing liquid.

The water-soluble compound to be used may be any water-soluble compound. For example, the water-soluble compound may be hydroxyethyl cellulose, glycerin, polyglycerin, polyvinyl alcohol, or carboxyl group- or sulfonic acid group-modified polyvinyl alcohol. The polishing composition of the present invention may contain such a water-soluble compound in an amount of 0.005% by mass to 1.0% by mass.

The polishing composition of the present invention may contain a chelating agent. Examples of the chelating agent include an aminocarboxylic acid chelating agent and a phosphonic acid chelating agent.

Examples of the aminocarboxylic acid chelating agent include ethylenediaminetetraacetic acid, nitrilotriacetic acid, diethylenetriaminepentaacetic acid, hydroxyethylethylenediaminetriacetic acid, triethylenetetraminehexaacetic acid, 1,3-propanediaminetetraacetic acid, 1,3-diamine-2-hydroxypropanetetraacetic acid, hydroxyethyliminodiacetic acid, dihydroxyethylglycine, glycol ether diaminetetraacetic acid, dicarboxymethylglutamic acid, and ethylenediamine-N,N'-disuccinic acid.

Examples of the phosphonic acid chelating agent include hydroxyethylidenediphosphonic acid, nitrilotris(methylenephosphonic acid), phosphonobutanetricarboxylic acid, and ethylenediaminetetra(methylenephosphonic acid).

The chelating agent may be contained in an amount of 0.005% by mass to 1.0% by mass relative to the polishing composition of the present invention.

Examples of the wafer to which the wafer polishing composition of the present invention can be applied include silicon wafer, SiC wafer, GaN wafer, GaAs wafer, GaP wafer, glass wafer, aluminum wafer, and sapphire wafer.

The polishing apparatus used for polishing of the wafer is of a single-side polishing type or a double-side polishing type. The wafer polishing composition of the present invention can be used in any of these types of apparatuses.

The use of the polishing composition of the present invention for a wafer polishing process can produce a wafer having a flat polished surface wherein the difference in level is small between the center of the wafer and the periphery (laser mark portion) of the wafer.

The polishing composition of the present invention can be used to polish a protrusion around a laser mark on a laser mark-provided wafer.

In the present invention, a step of preliminarily polishing a laser mark-provided wafer can be followed by a step of polishing a protrusion around a laser mark on the laser mark-provided wafer by using the polishing composition of the present invention.

Thus, a laser-mark-around protrusion having a height of 50 nm to 500 nm or 50 nm to 200 nm as measured from the horizontal surface of the wafer can be polished so as to have a height of 30 nm to −10 nm, preferably 25 nm to 0 nm, more preferably 0 nm, as measured from the horizontal surface. A height of about −10 nm of the polished laser-mark-around protrusion is attributed to the state where the laser-mark-around protrusion is polished and scraped down toward a laser mark dent so as to have a height of about −10 nm. Such a negative value is due to polishing of the edge of the dent, and the height is ideally and preferably 0 nm.

EXAMPLES (Synthesis Example 1) Synthesis of TMA Silicate (Tetramethylammonium Silicate)

A silica sol having a silica concentration of 35% by mass was subjected to ion exchange with a cation exchange resin (Amberlite IR-120B, available from Organo Corporation), and 3,060 g of ion-exchange water was added to 2,940 g of the resultant acidic silica sol (alkali content: 0.03% by mass), followed by addition of 4,000 g of 25% tetramethylammonium hydroxide with stirring. The resultant solution was heated to 80° C. with stirring and then retained for six hours, to thereby prepare a desired TMA silicate solution.

The resultant TMA silicate was found to have a ratio by mole in terms of $SiO_2/M_2O$ of 3.0 (M is tetramethylammonium), an $SiO_2$ concentration of 10% by mass, a tetraalkylammonium hydroxide concentration of 10% by mass, and a solid content of 20% by mass.

(Synthesis Example 2) Synthesis of K Silicate (Potassium Silicate)

A silica sol having a silica concentration of 35% by mass was subjected to ion exchange with a cation exchange resin (Amberlite IR-120B, available from Organo Corporation), and 2,100 g of ion-exchange water was added to 5,880 g of the resultant acidic silica sol (alkali content: 0.03% by mass), followed by heating to 43° C. with stirring. After the heating, 2,020 g of 48% potassium hydroxide was added with stirring, and the resultant solution was heated to 96° C. with stirring and then retained for six hours, to thereby prepare a desired K silicate solution.

The resultant K silicate was found to have a ratio by mole in terms of $SiO_2/M_2O$ of 3.85 (M is potassium), an $SiO_2$ concentration of 20% by mass, a potassium hydroxide concentration of 9.7% by mass, and a solid content of 30% by mass.

(Preparation of Polishing Composition)

Colloidal silica having an average primary particle diameter of 45 nm as determined by the nitrogen adsorption method (BET method) (silica abrasive grains, trade name: Snowtex (silica particles based on silica sol), available from Nissan Chemical Corporation), alkali silicate (the aforementioned TMA silicate of Synthesis Example 1 or the aforementioned K silicate of Synthesis Example 2), a hydroxide, a carbonate, a chelating agent (ethylenediaminetetraacetic acid tetrasodium salt), and glycerin were incorporated in proportions described below (the residue was water), to thereby produce a polishing composition.

Ethylenediaminetetraacetic acid was incorporated in an amount of 0.2% by mass in Examples 1 to 8 and Comparative Examples 1 to 3, and glycerin was incorporated in an amount of 0.3% by mass in Examples 1 to 8 and Comparative Examples 1 to 3.

The amounts of silica particles based on silica sol ($SiO_2$% by mass), dissolved silica component ($SiO_2$% by mass), and cation (% by mass) contained in the resultant polishing composition are shown below.

TMA denotes tetramethylammonium ion; TMAH, tetramethylammonium hydroxide; TMAS, tetramethylammonium silicate; TMAC, tetramethylammonium carbonate; KS, potassium silicate; and KC, potassium carbonate.

The aforementioned carbonate functions as a pH buffer. The aforementioned hydroxide functions as a pH adjuster.

TABLE 1

| Example | Silica particles $SiO_2$ % by mass | Dissolved silica $SiO_2$ % by mass | TMA ion % by mass |
|---|---|---|---|
| Example 1 | 8 | 2.8 | 6.5 |
| Example 2 | 8 | 2.8 | 3.3 |
| Example 3 | 8 | 7.3 | 6.0 |
| Example 4 | 8 | 6.0 | 4.9 |
| Example 5 | 8 | 4.0 | 3.3 |
| Example 6 | 8 | 2.8 | 6.5 |
| Example 7 | 8 | 2.8 | 3.3 |
| Example 8 | 8 | 1.5 | 3.3 |
| Comparative Example 1 | 8 | 0 | 2.2 |
| Comparative Example 2 | 8 | 4.0 | 2.7 |
| Comparative Example 3 | 8 | 0 | 4.2 |

TABLE 2

| Example | (TMA ion)/ ($SiO_2$ particles) | (Dissolved $SiO_2$)/ ($SiO_2$ particles) | Origin of cation component |
|---|---|---|---|
| Example 1 | 0.813 | 0.350 | TMAS, TMAH, TMAC |
| Example 2 | 0.413 | 0.350 | TMAS, TMAH |
| Example 3 | 0.750 | 0.913 | TMAS |
| Example 4 | 0.613 | 0.750 | TMAS |
| Example 5 | 0.413 | 0.500 | TMAS |
| Example 6 | 0.813 | 0.350 | TMAH, TMAC, KS |
| Example 7 | 0.413 | 0.350 | TMAH, KS |
| Example 8 | 0.413 | 0.188 | TMAH, KS |
| Comparative Example 1 | 0.275 | 0 | TMAH, KC |
| Comparative Example 2 | 0.338 | 0.500 | TMAC, KS |
| Comparative Example 3 | 0.525 | 0 | TMAH, TMAC |

Each of the polishing compositions of Examples 1 to 8 and Comparative Examples 1 to 3 was 10-fold diluted with pure water (i.e., the concentration of $SiO_2$ abrasive grains in the polishing composition was adjusted to 0.8% by mass) and used for the polishing test described below.

(Polishing Conditions)

A double-side polishing machine (trade name: 13BF) available from HAMAI CO., LTD. was used as a polishing machine.

The size of a surface plate was as follows: outer diameter: 933.4 mm, inner diameter: 349.4 mm.

The wafer to be polished was a silicon wafer having a diameter of 200 mm, p-type conduction, a crystal orientation defined by the Miller index <100>, and a resistivity of 100 Ω·cm or less.

One silicon wafer was set in a carrier, and three sets (i.e., a total of three silicon wafers) were simultaneously polished.

The polishing pad used was LP-57 (trade name) available from JH Rhodes Company, Inc. (groove width: 2 mm, groove pitch: 20 mm).

The polishing load was 150 g/cm².

The rotation speed of a lower surface plate was 20 rpm, the rotation speed of an upper surface plate was 6.6 rpm, and the rotation speed ratio was 3.0.

The polishing time was 60 minutes per batch, and 3-batch polishing was performed with the same polishing pad.

The amount of the polishing liquid was 25 L, and the polishing liquid was supplied at a rate of 6.4 L/minute. Replenishment with a new polishing liquid was not performed during polishing.

The temperature of the polishing liquid was 23° C. to 25° C. during polishing.

(Results of Polishing Test)

In Table 3, "Polishing speed" corresponds to the average polishing speed (μm/minute) of three batches, "Laser mark eliminability" corresponds to the height of a laser mark (height (nm) as measured from the silicon wafer) at the third batch, and "pH" corresponds to initial pH and pH at each batch.

The height of a laser mark was measured by the following method. Specifically, an optical interference microscope system BW-M7000 available from NIKON INSTECH CO., LTD. was used to measure the difference in height between the highest portion and lowest portion on the surface of the wafer with respect to a roughness curve prepared by scanning of a constant width (500 μm).

TABLE 3

| Example | Polishing speed (μm/minute) | Laser mark eliminability (nm) | pH Initial | pH 1st batch | pH 2nd batch | pH 3rd batch |
|---|---|---|---|---|---|---|
| Example 1 | 0.34 | 0 | 11.1 | 11.0 | 10.9 | 10.8 |
| Example 2 | 0.33 | 0 | 11.2 | 11.0 | 10.9 | 10.8 |
| Example 3 | 0.34 | 0 | 11.2 | 11.2 | 11.1 | 11.1 |
| Example 4 | 0.35 | 0 | 11.2 | 11.1 | 11.1 | 11.0 |
| Example 5 | 0.35 | 0 | 11.1 | 11.0 | 10.9 | 10.8 |
| Example 6 | 0.36 | 0 | 11.0 | 10.9 | 10.9 | 10.9 |
| Example 7 | 0.34 | 0 | 11.1 | 11.1 | 11.1 | 11.0 |
| Example 8 | 0.33 | 0 | 11.1 | 11.1 | 11.0 | 11.0 |
| Comparative Example 1 | 0.35 | 72 | 10.9 | 10.8 | 10.8 | 10.7 |
| Comparative Example 2 | 0.37 | 29 | 10.9 | 10.9 | 10.8 | 10.8 |
| Comparative Example 3 | 0.36 | 12 | 11.1 | 10.6 | 10.4 | 10.3 |

The results indicated that the components other than silica particles and water play a large role in the polishing composition of the present invention, and incorporation of a specific amount of a tetraalkylammonium ion and a specific amount of dissolved silica achieves excellent laser mark eliminability. This is probably attributed to the fact that the polishing composition contains a dissolved silica component together with silica abrasive grains. The abrasive particles are silica particles, and, needless to say, the silanol group contained in the silica particles contributes to hydrophilicity. The presence of the dissolved silica component together with the silica particles makes the silica particles (i.e., abrasive grains) hydrophilic. Conceivably, the resultant hydrophilic silica particles efficiently come into contact with a protrusion around a laser mark, to thereby flatten the protrusion. The silica abrasive grains in the polishing composition are dissolved in the polishing composition by the alkaline component to reach a dissolution equilibrium. However, the incorporation of an alkali silicate (i.e., the presence of an initially dissolved silica component) prevents dissolution of the silica abrasive grains into the polishing composition, whereby a high pH can be maintained and dissolution of the silica abrasive grains can be prevented in the entire polishing process. Thus, the silica particles (silica abrasive grains) effectively polish the laser mark, which probably leads to good laser mark eliminability from the initial stage of the pad to the second batch and the third batch.

In contrast, the aforementioned effects cannot be achieved at the initial stage of polishing in Comparative Examples 1 and 3 wherein a dissolved silica component is not incorporated. In Comparative Example 2, a dissolved silica component is incorporated, but a specific amount of a tetramethylammonium ion is not incorporated, which probably results in failure to maintain a high pH.

INDUSTRIAL APPLICABILITY

The use of the polishing composition of the present invention in a wafer polishing process can eliminate a protrusion around a laser mark, to thereby achieve a flat polished surface.

The invention claimed is:

1. A polishing composition for use in a wafer polishing process for achieving a flat polished surface having no level difference around a wafer, the polishing composition comprising silica particles, water, and a tetraalkylammonium ion, wherein:
   a mass ratio of the tetraalkylammonium ion to $SiO_2$ of the silica particles is 0.400 to 0.813:1,
   a mass ratio of $SiO_2$ dissolved in the polishing composition to $SiO_2$ of the silica particles is 0.100 to 0.913:1,
   the dissolved $SiO_2$ is derived from a tetraalkylammonium silicate, and silicate and
   the dissolved $SiO_2$ is contained in the polishing composition in an amount of 0.1% by mass to 7.3% by mass.

2. The polishing composition according to claim 1, wherein the tetraalkylammonium ion is derived from a compound selected from the group consisting of an alkali silicate, a hydroxide, a carbonate, a sulfate, and a halide, and the tetraalkylammonium ion is contained in the polishing composition in an amount of 0.2% by mass to 8.0% by mass.

3. The polishing composition according to claim 1, wherein the dissolved $SiO_2$ is silica having an average primary particle diameter of less than 1 nm, or a silicate anion.

4. The polishing composition according to claim 1, wherein the tetraalkylammonium ion is a tetramethylammonium ion, a tetraethylammonium ion, a tetrapropylammonium ion, a tetrabutylammonium ion, an ethyltrimethylammonium ion, a diethyldimethylammonium ion, a methyltriethylammonium ion, or a mixture of any of these.

5. The polishing composition according to claim 1, wherein the silica particles have an average primary particle diameter of 1 nm to 100 nm, and the polishing composition has a silica concentration based on the silica particles of 0.1% by mass to 30% by mass.

6. The polishing composition according to claim 1, wherein the polishing composition has pH of 11 to 13.

7. The polishing composition according to claim 1, wherein the polishing composition is used for elimination of a laser mark of a silicon wafer.

8. A method for eliminating a laser mark of a silicon wafer, the method using the polishing composition according to claim 1.

9. A method for producing the polishing composition according to claim 1, the method comprising a step of mixing an aqueous silica sol with a tetraalkylammonium hydroxide, a potassium hydroxide, a sodium hydroxide, or a mixture of any of these, heating the resultant mixture at 40° C. to 100° C. for 0.5 hours to 20 hours to thereby produce an alkali silicate, and generating dissolved $SiO_2$ derived from the alkali silicate.

10. A method for producing the polishing composition according to claim 1, the method comprising a step of mixing an aqueous silica sol with a tetraalkylammonium silicate, a potassium silicate, a sodium silicate, or a mixture of any of these.

11. A method for producing a polishing composition, the method comprising a step of diluting the polishing composition according to claim 1 with water before or during polishing of a to-be-polished material so that the silica concentration based on the silica particles is adjusted to 0.1% by mass to 4.0% by mass, the tetraalkylammonium ion concentration is adjusted to 0.2% by mass to 4.0% by mass, and the dissolved $SiO_2$ concentration is adjusted to 0.1% by mass to 2.0% by mass.

12. A method for polishing a silicon wafer, the method using a polishing composition produced by the method according to claim 11.

* * * * *